United States Patent [19]

Stephens, Jr. et al.

[11] Patent Number: 5,347,184
[45] Date of Patent: Sep. 13, 1994

[54] DUAL RECEIVER EDGE-TRIGGERED DIGITAL SIGNAL LEVEL DETECTION SYSTEM

[75] Inventors: Michael C. Stephens, Jr., Stafford; Roger D. Norwood, Sugar Land; Duy-Loan T. Le, Missouri City; Kenneth A. Poteet, Sugar Land, all of Tex.

[73] Assignee: Texas Instruments Incorporated, Dallas, Tex.

[21] Appl. No.: 998,166

[22] Filed: Dec. 29, 1992

[51] Int. Cl.$^5$ .............................................. H03K 19/01
[52] U.S. Cl. ...................................... 307/480; 307/409; 307/445; 365/193
[58] Field of Search ...................... 307/530, 445, 272.1, 307/296.2, 279, 480, 409; 365/193

[56] References Cited

U.S. PATENT DOCUMENTS

| | | | |
|---|---|---|---|
| 4,719,629 | 1/1988 | Wang | 307/445 |
| 4,900,949 | 2/1990 | Saitoh | 307/530 |
| 5,083,049 | 1/1992 | Kagey | 307/272.1 |
| 5,111,433 | 5/1992 | Miyamoto | 365/233 |

Primary Examiner—Timothy P. Callahan
Assistant Examiner—T. Englund
Attorney, Agent, or Firm—Lawrence J. Bassuk; Leo N. Heiting; Richard L. Donaldson

[57] ABSTRACT

Two separate receivers (120,122) receive the input signal (128) and the clock signal (126). During the inactive state of the clock signal, the first receiver produces a low state output (130) and the second receiver produces a high state output (132). Both outputs feed combinational logic (124), which produces two outputs (142,144) both normally low. Upon transition of the clock signal, the output of only one of the receivers changes state to match the logic state of the input signal. The output of the other receiver maintains its logic state. Upon the change in the clock signal, only one of the combinational logic outputs changes state to a logical high state to indicate the state of the one input signal.

8 Claims, 4 Drawing Sheets

DUAL RECEIVER EDGE-TRIGGERED DIGITAL SIGNAL LEVEL DETECTION SYSTEM

FIELD OF THE INVENTION

This invention relates generally to detecting quickly the change in logical or voltage state of an input signal, and particularly relates to an input buffer circuit quickly detecting the logical or voltage state of the signal CAS_ (Column Address Strobe_) at the change of RAS_ (Row Address Strobe_) in a dynamic random access memory device.

DESCRIPTION OF THE RELATED ART

Digital signal level detection is a very simple, yet quite important, function in most integrated circuits. This detection determines the state of one signal, such as CAS_, when a clocking signal, such as RAS_, changes state so that a specified control operation, such as CAS before RAS refresh, can be performed.

Where the input signal must be received from off-chip, the level detection process is time consuming.

The prior solution to this problem uses a clock signal to enable an input receiver. The receiver senses the state of a particular input signal and passes it through to combinational logic, which recognizes the state of the input signal and which is also enabled by the clock signal. Before the appropriate state of the input signal can be recognized, however, the transition of the clock signal must go through a delay path designed to account for the response time of the input receiver. The delay path is needed with this approach because the flow-through property of the combinational logic would identify the output of the receiver before the state of the input signal properly propagates through the receiver to its output; this could possibly result in a false initial state of the input receiver being recognized in the combinational logic. That is, if the output of the receiver is initially logic low ('0') prior to the enabling transition of the clock signal, but the state of the input signal is logic high ('1'), then the combinational logic cannot be allowed to perform its function until the output of the receiver has reflected the opposing input signal level by driving its output high.

If the added delay stage is precisely designed so as to exactly model the response time of the input receiver over all possible operating conditions, then the system might be considered ideal. However, in real design situations, delay margin must be added at this point to account not only for variations over operating conditions, but also to account for a lack of response time correlation between sensing a logic high as compared to sensing a logic low.

SUMMARY OF THE INVENTION

This invention recognizes and addresses the extra delay added for design margin in the prior signal level detection systems.

This invention uses two signal receivers for one off-chip input signal where the output of one receiver is initially charged high while the output of the other is initially low. The output of one of these two receivers must change state in response to the sensed input signal, after being enabled by the clock signal, to produce a transition edge that drives further state changes within the combinational logic. The combinational logic thus becomes completely flow-through; it does not have to wait on a delay of the clock signal before it can begin performing its function. Since no additional delay is added to the circuit, the system as a whole operates consistently faster.

DESCRIPTION OF THE PREFERRED EMBODIMENT

The dual receiver, edge-triggered level detection system described is used in a family of DRAM devices constructed and arranged to furnish one million words of eighteen bits, 1M×18, or two million words of nine bits, 2M×9. The following description pertains to the 1M×18 part with a 4 k refresh option.

In these devices, the received RAS_ signal also serves as a chip select, or chip activation signal. This implies that the chip-internal RAS_ signal must be used to enable several control signal receivers and that the RAS_ signal receiver must remain enabled whenever the device receives power. Also, several standard DRAM operating modes are identified and entered based on the state of other chip-external control signals with respect to the RAS_ signal transition.

The 1M×18/2M×9 family of DRAM devices employs this invention for fast CAS_ before RAS_ (CBR) and RAS_ before CAS_ (RBC) cycle detection. Of course, a similar system could easily be used at any one of the other clocks which are enabled by RAS_.

Figure 1:
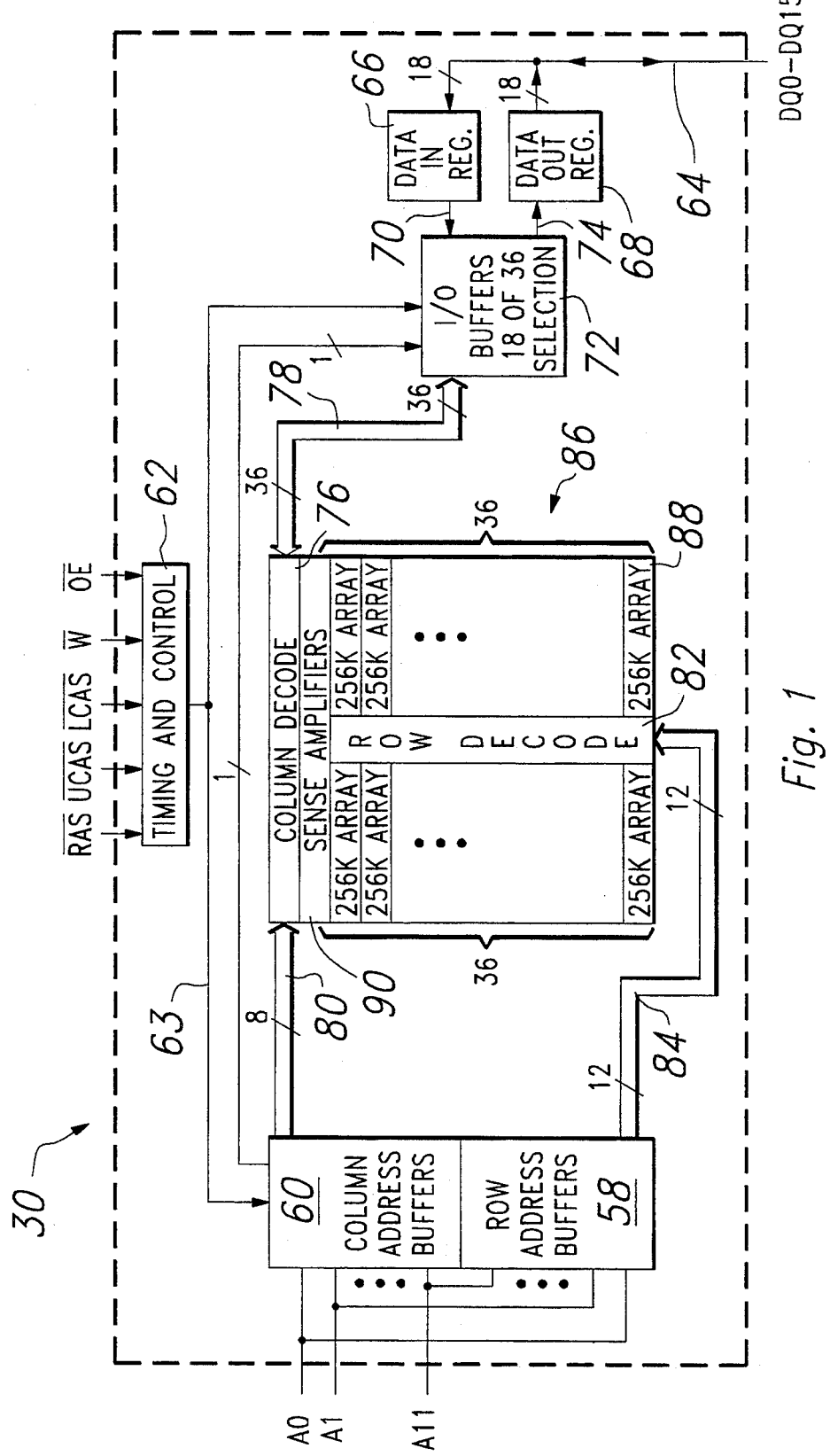
FIG. 1 is a block diagram of a memory device incorporating the level detection system of the invention.

In FIG. 1, DRAM device 30 receives address signals A0–A11 in row address buffers 58 and column address buffers 60. The address signals become latched in the address buffers by use of control signals: RAS_, Upper Column Address Strobe, UCAS_, and Lower Column Address Strobe, LCAS_, received in timing and control block 62. Leads 63 carry desired timing and control signals from block 62 to buffers 58 and 60.

Data signals DQ0–DQ17 are carried in parallel on leads 64 to data in register 66 and data out register 68. Eighteen data signals in parallel pass across leads 70 from data in register 66 to the 18 I/O buffers 72 and 18 data signals in parallel pass across data leads 74 from the 18 I/O buffers 72 to the data out register 68. Eighteen data signals in parallel pass from the I/O buffers 72 to the column decoders 76 across leads 78. The I/O buffers 72 also receive timing and control signals over leads 63 from timing and control block 62. Column decoders 76 receive 8 address signals in parallel across leads 80 from column address buffers 60. Row decoders 82 receive 12 address signals in parallel over leads 84 from row address buffers 58. Column decoders 76 and row decoders 82 address individual memory cells in overall array 86, which includes 18,874,368 data bits configured in 1,048,576 (1M) words by 18 bits per word. Overall array 86 contains 72 array parts such as array part 88 with each array part containing 256K of data bits. Thirty six array parts are located on either side of row decoders 82. The data signals from the selected rows of data bits in the array parts pass through sense amplifiers 90 to column decoders 76.

Control signals Write, W_, and output enable, OE_, connect to timing and control block 62 to indicate and control the writing and reading of data signals from overall array 86.

Please understand that this text uses an underline character following the name or acronym for a signal to indicate the active low state. This facilitates text preparation using a word processor, even though the drawing may use an overscore to indicate the active low state.

Figure 2:
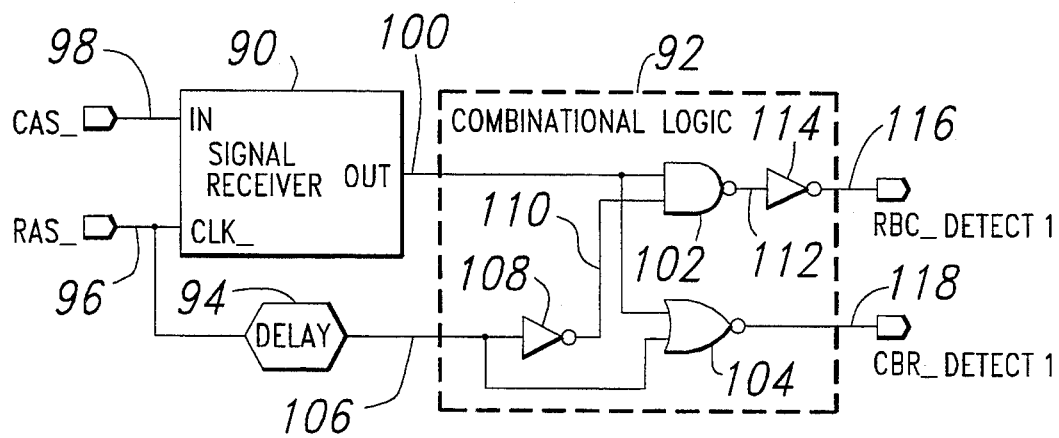
FIG. 2 is a block diagram of a known digital signal level detection system.

In FIG. 2, a known arrangement, an input signal receiver 90 receives an input signal and a clock signal and passes the input signal to combinational logic 92. The clock signal passes through a delay 94 on its way to combinational logic 92. The clock signal, RAS_, on lead 96 enables the signal receiver 90 to sense the state of input signal CAS_ on lead 98 and pass it through to the combinational logic 92. Before the appropriate state of CAS_ can be recognized in the combinational logic 92, the RAS_ transition must go through the delay 94 path designed to account for the response time of the signal receiver 90.

The approach of the present invention avoids the need for extra delay 94, added for design margin.

Combinational logic 92 receives the output of receiver 90 on lead 100, which carries it to the inputs of nand gate 102 and nor gate 104. Combinational logic 92 receives the output of delay 94 on lead 106, which carries it to the input of inverter 108 and to the input of nor gate 104. Lead 110 carries the output of inverter 108 to the input of nand gate 102. The output of nand gate 102 occurs on lead 112 and passes through inverter 114 to form the signal RBC_ Detect 1 on lead 116. The output of nor gate 104 forms the signal CBR_ Detect 1 on lead 118.

In operation, the delay 94 is selected by design to guarantee a delay of the clock enabling signal RAS_ from propagating into combinational logic 92 until after the CAS_ signal propagates through the receiver 90 and attains a steady state at the inputs of the nand and nor gates 102 and 104. After the selected time delay, the RAS_ signal enables the steady state of the CAS_ signal output by the receiver to pass through the gates 102 and 104 to form the corresponding logic levels for the signals RBC_ Detect 1 and CBR_ Detect 1.

The circuit of FIG. 2 depicts a schematic example of the known approach to RBC/CBR cycle detection. Here, signal receiver 90 is a standard non-inverting TTL input receiver with its output charged high when disabled (when RAS_=ENABLE_=high). This circuit diagram does not include a latching circuit that is usually used to latch the states of RBC_ Detect 1 and CBR_Detect 1 for the duration of the RAS_=low cycle. The latch circuitry is excluded here for simplicity. So, FIG. 2 simply illustrates the basic detection circuitry found in conventional clock detection systems. The delay 94 is a standard 2 ns delay stage in this implementation. So, based on the state of the output of receiver 90 on lead 100 at the time the output of the delay goes low in response to RAS_ going low, either RBC_ Detect 1 or CBR_ Detect 1 is set according to the detection logic formed by nand gate 102, nor gate 104 and inverter 114.

Figure 3:
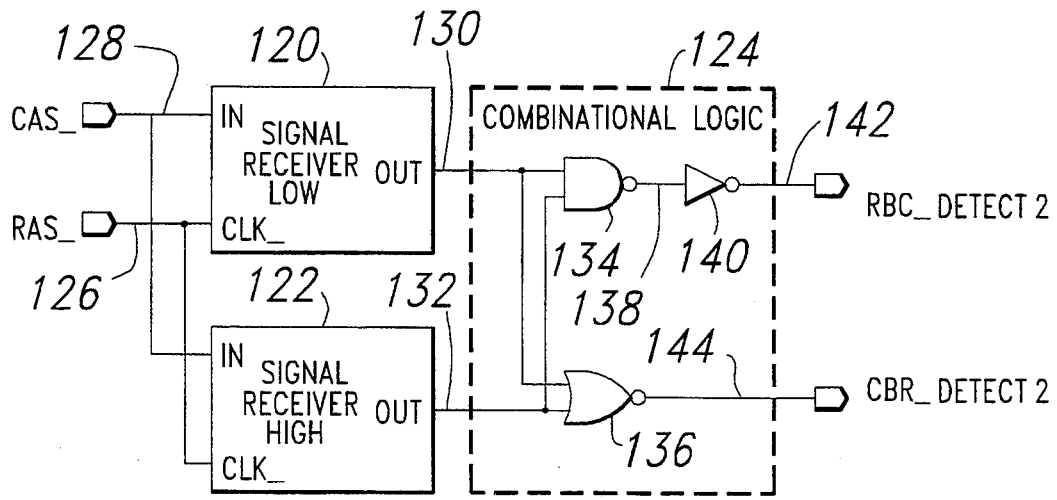
FIG. 3 is a block diagram of a dual receiver edge-triggered digital signal level detection system of the claimed invention.

In FIG. 3, a preferred embodiment of the invention furnishes a signal receiver low 120 and a signal receiver high 122; an output of each receiver passes to combinational logic 124 to form the desired output signals. A clock signal RAS_ occurs on lead 126 and as an input to both receivers 120 and 122. The input signal CAS_ occurs on lead 128 and as an input to both receivers 120 and 122. The outputs of receivers 120 and 122 occur respectively on leads 130 and 132 and pass to combinational logic 124.

The operation of the two signal receivers 120 and 122 are similar, save their initial—prior to CLK enabling—output states. These two initial states are opposite and are reflected in the names of the receivers. The initial state of the output of receiver 120 is low and the initial state of the output of receiver 122 is high.

Combinational logic 124 receives the outputs of receivers 120 and 122 on leads 130 and 132 and respectively applies them to the inputs of nand gate 134 and nor gate 136. The output of nand gate 134 occurs on lead 138, drives inverter 140 and produces the signal RBC_ Detect 2 on lead 142. The output of nor gate 136 occurs on lead 144 to form signal CBR_ Detect 2.

The combinational logic 124 is flow-through in that it is edge-triggered based on the transition of either the output of receiver low 120 or receiver high 122. No other signal holds off the propagation through this logic 124. That is, when CAS_ is stable and RAS_ fires and enables the signal receivers, only one of the outputs of receiver low 120 or receiver high 122 will change state after the response time of the signal receivers has passed. This sole transition then forces state changes in the combinational logic. RBC_ Detect 2 or CBR_ Detect 2 then fire appropriately after the inherent propagation delays of the devices involved in the combinational logic.

The circuit diagram in FIG. 3 also excludes any latch circuit for simplicity. The output of receiver low 120 is precharged low when disabled and the output of receiver high 122 is precharged high when disabled. Also, both of these receivers are noninverting. For this combinational logic, a transition on either lead 130 or 132 triggers state transitions through the combinational logic and either RBC_ Detect 2 or CBR_ Detect 2 is set high.

Figure 4:
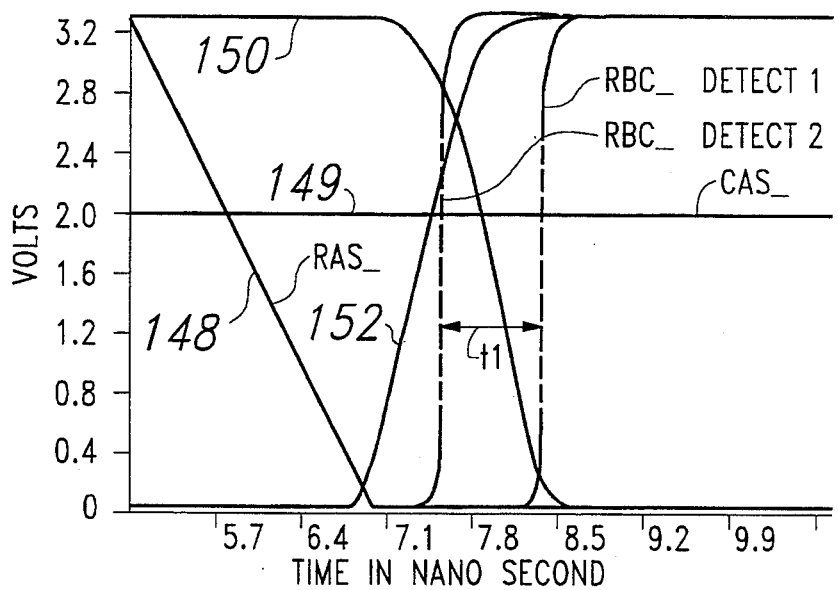
FIG. 4 is a timing diagram depicting results of an RBC detection simulation showing typical speed differences between the known approach and the approach of the claimed invention.
Figure 5:
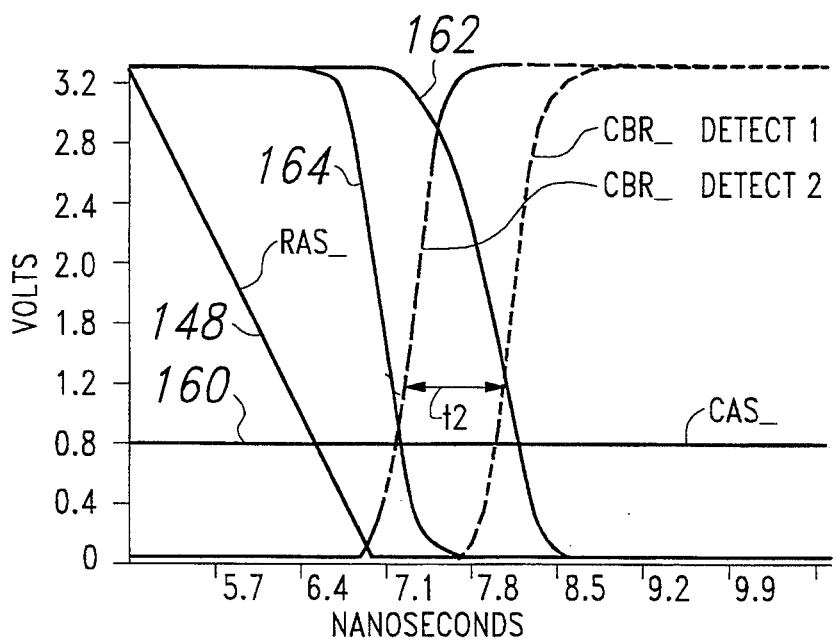
FIG. 5 is a timing diagram depicting results of a CBR detection simulation showing typical speed differences between the known approach and the approach of the claimed invention.

FIGS. 4 and 5 illustrate the potential detection speed advantages of the non-conventional approach to this problem. The two circuits depicted in FIGS. 2 and 3 were machine simulated under identical conditions and with the same input signal wave forms.

FIG. 4 depicts the simulation results for the RBC detection case. The clock signal RAS_, waveform 148, ramps or transitions low while CAS_, wave form 149, remains high at a constant 2.0 volts. The wave form 150 is the output of delay 94 on lead 106 of FIG. 2. Wave form 152 is the output of receiver 120 on lead 130 of FIG. 3. Before wave form 150 goes to a logic low level at 0.8 volts to provide sufficient time for the receiver 90 to respond, wave form 152 has already made a low-to-high transition to above logic high level at 2.0 volts that causes RBC_ Detect 2 to fire high faster than RBC_ Detect 1.

The time difference t1 for this example is 0.84 ns between the respective RBC_ Detect firings. This time represents the unnecessary delay that might be included in the conventional approach to provide design timing margin to ensure proper detection under all possible operating conditions. The present invention avoids this delay.

FIG. 5 depicts the simulation results for the CBR detection case. The RAS_ signal, wave form 148, ramps or transitions low while the signal CAS_, wave form 160, occurs at a TTL low logic level of 0.8 volts prior to RAS_ falling. Wave form 162 is the output of receiver 90 on lead 100 in FIG. 2, and wave form 164 is the output of receiver high 122 on lead 132 in FIG. 3. Before wave form 162 goes to a logic low level at 0.8 volts to provide sufficient time for the receiver 90 to respond, wave form 164 has already made a high-to-low transition to below logic low level at 0.8 volts to cause CBR_ Detect 2 to fire high faster than CBR_ Detect 1.

For this case, signal receiver high 122, not signal receiver low 120, makes the early transition. The CBR_ Detect 2 firing point time difference t2 for this case was measured to be 0.90 ns.

Figure 6:
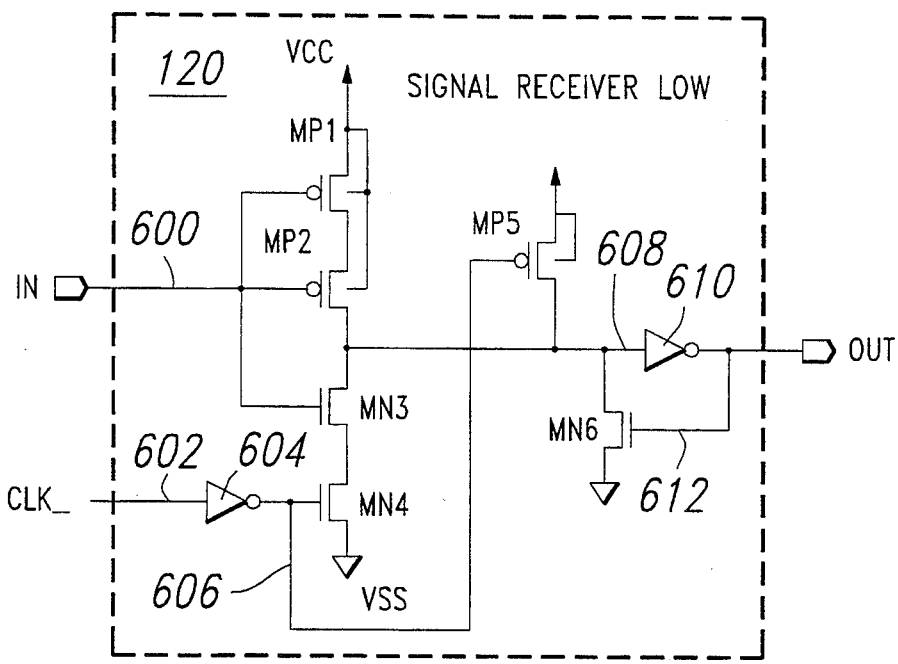
FIG. 6 is a circuit diagram of an input receiver circuit having an output precharged low.

In FIG. 6, receiver low 120 includes four transistors mp1, mp2, mn3, and mn4 connected in series between VCC and VSS. The input signal In on lead 600 connects to the gates of transistors mp1, mp2 and mn3. The input signal Clk_ on lead 602 passes through inverter 604 to lead 606 and the gates of transistors mn4 and mp5. Lead 608 connects between transistors mp2, mn3, mp5, mn6 and inverter 610. The output of inverter 610 produces the Out signal on lead 612 and connects to the gate of transistor mn6. Transistor mp5 connects between VCC and lead 608. Transistor mn6 connects between lead 608 and VSS.

In operation, the signal Clk_ being an inactive high puts a low on lead 606, which keeps the transistor mn4 off while keeping the transistor mp5 on. This drives lead 608 high and the Out signal low. The Out signal being low also turns off transistor mn6. Transistor mn6 provides some hysteresis in the transition of the Out signal going high and going low.

If the In signal takes a high state, it turns off transistors mp1 and mp2 while turning on transistor mn3. When the Clk_ signal takes an active low state, transistor mp5 turns off, removing VCC from lead 608 and transistor mn4 turns on, providing a path for the charge on lead 608 to drain to VSS through on transistor mn3, taking lead 608 low. Lead 608 being low forces the inverter to drive the Out signal high, in turn turning on transistor mn6 and keeping lead 608 low.

If the In signal takes a low state, it turns on transistors mp1 and mp2 while turning off transistor mn3. When the Clk_ signal takes an active low state, transistor mp5 turns off, removing VCC from lead 608 and transistor mn4 turns on. Because transistor mn3 is turned off, there is no path for the charge on lead 608 to drain to VSS. Instead transistors mp1 and mp2 conduct VCC to lead 608 to keep it high. The Out signal thus remains low, with transistor mn6 turned off.

Figure 7:
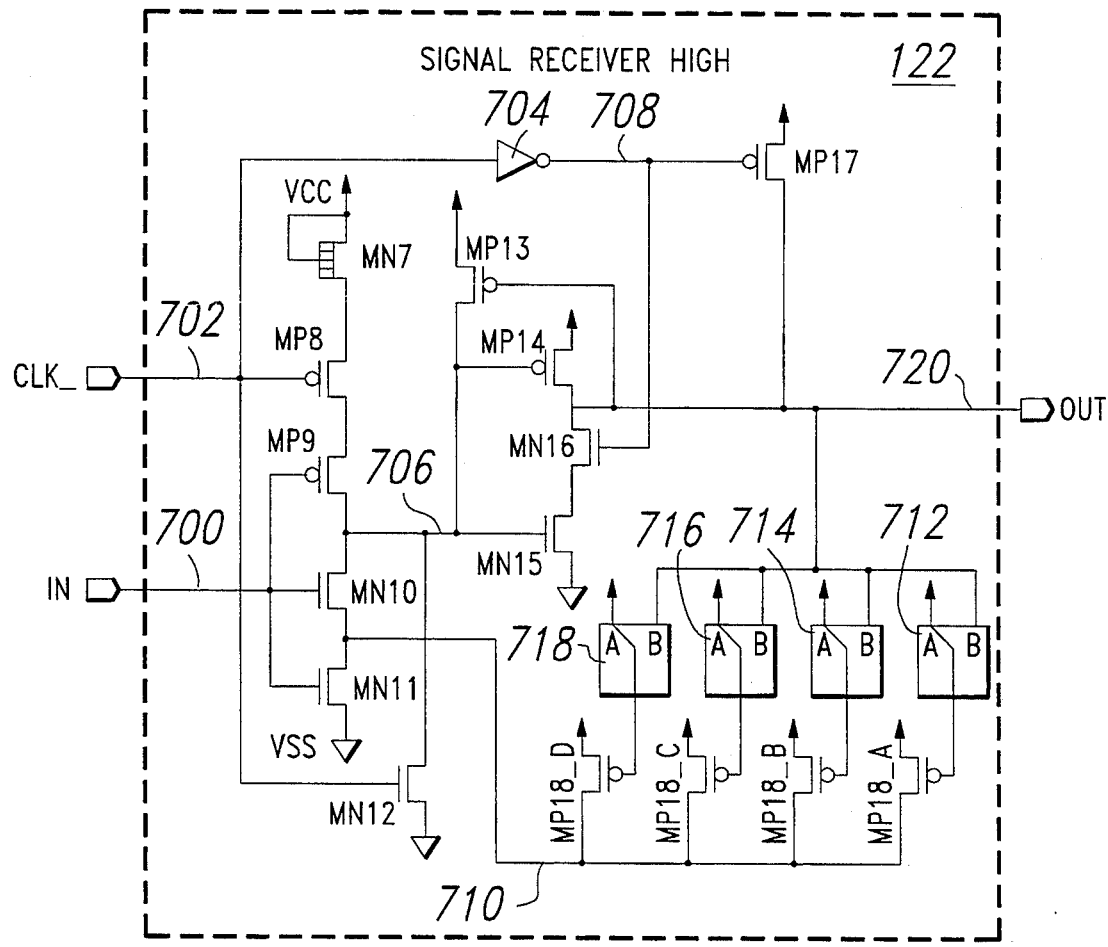
FIG. 7 is a circuit diagram of an input receiver circuit having an output precharged high.

In FIG. 7, receiver high 122 includes five transistors mn7, mp8, mp9, mn10, and mn11 connected in series between VCC and VSS. The In signal on lead 700 connects to the gates of transistors mp9, mn10, and mn11. The Clk_ signal on lead 702 connects to the gate of transistors mp8 and mn12 and to inverter 704. The gate of transistor mn7 connects to VCC. Lead 706 connects between transistors mp9, mn10, mn12, mp13, and the gates of mp14 and mn15. Transistors mp14 and mn15 connect in series between VCC and VSS with transistor mn16. Lead 708 connects between the output of inverter 704 and the gates of transistors mn16 and mp17. Lead 710 connects between transistors mn10, mn11 and transistors mp18_a, mp18_b, mp18_c, and mp18_d. The gates of transistors mp18_a through mp18_d respectively connect through programmable switches 712 through 718 to lead 720. Lead 720 carries the Out signal and connects between the gate of transistor mp13, transistors mp14, mn16 and mp17 and switches 712 through 718.

The transistors mp18 have channel widths of increasing size to furnish hysteresis in the transitions of the Out signal going high and going low.

In operation, the inactive high state of Clk_ signal turns off transistor mp8, turns on transistor mn12, and, through inverter 704, turns on transistor mp17 while turning off transistor mn16. This pulls lead 706 low to VSS through transistor mn12 and drives lead 720 high to VCC through transistor mp17. Lead 706 being low turns off transistor mn15 and turns on transistor mp14, which helps drive lead 720 high to VCC. Lead 720 being high turns transistor mp13 off and turns off transistor mp18_a.

If the In signal takes a high state, it turns off transistor mp9 and turns on transistors mn10 and mn11, keeping lead 706 low. When the signal Clk_ goes to an active low, it turns off transistor mn12, turns on transistor mp8 and, through inverter 704, turns off transistor mp17 and turns on transistor mn16. Lead 720 and the Out signal remain high due to transistor mp14 remaining on and transistor mn15 remaining off.

If the In signal takes a low state, it turns on transistor mp9 and turns off transistors mn10 and mn11. When the signal Clk_ goes to an active low, it turns off transistor mn12 and turns on transistor mp8. This drives lead 706 high from VCC through transistors mn7, mp8 and mp9. Lead 706 going high turns on transistor mn15 and turns off transistor mp14. The Clk_ signal going to an active low also acts through invertor 704 to turn off transistor mp17 and turn on transistor mn16. Transistor mp14 being off isolates lead 720 from VCC and transistors mn15 and mn16 being on pulls the lead 720 and the Out signal low to VSS. Lead 720 being low, also turns on transistor mp13, which contributes to driving lead 706 to VCC.

The claimed invention can be practiced other than as specifically described. For example, the DRAM device depicted in FIG. 1 can have different numbers of the same parts to obtain other arrangements of bits and words in a DRAM device. Also, the receiver can be used in other types of logic circuits. It can receive logic signals other than TTL and it can generate logic signals other than CMOS. Also the specific circuits depicted in FIGS. 6 and 7 can change while remaining within the scope of the appended claims. Moreover the output of the claimed system can be applied to a latch to hold the indicated state of the In or CAS_ signal.

We claim:

1. A level detection system receiving two input signals to indicate one or another logic state of the first input signal at the transition of the second input signal from an inactive state to an active state, the system comprising:

A. a first signal receiver having a first input receiving the first input signal, and a second input receiving the second input signal, the first signal receiver having an output producing an output signal of one logic state while the second input signal is inactive and an output signal of the same logic state as the first input signal While the second input signal is active;

B. a second signal receiver having a first input receiving the first input signal, and a second input receiving the second input signal, the second signal receiver having an output producing an output signal of another logic state while the second input signal is inactive and an output signal of the same logic state as the first input signal while the second input signal is active; and C. combinational logic receiving the output signals from the two receivers and producing at least one indicate signal of the same logic state as the first input signal in response to a change in logic state in one of the outputs from the receivers.

2. The system of claim 1 in which the combinational logic produces two indicate signals, a first indicating the first input signal being in one logic state at the transition of the second input signal, and a second indicating the first input signal being at the other logic state at the transition of the second input signal.

3. The system of claim 2 in which the first input signal is column address strobe, CAS_, and the second input signal is row address strobe, RAS_, and the first indicate signal indicates a RAS_ before CAS_ condition and the second indicate signal indicates a CAS_ before RAS_ condition.

4. The system of claim 2 in which the combinational logic includes a nand gate receiving the outputs of both receivers and producing the first indicate signal through an inverter, and the combinational logic includes a nor gate receiving the outputs of both receivers and producing the second indicate signal directly.

5. The system of claim 1 in which the second input signal has an inactive high logic state and an active low logic state.

6. The system of claim 1 in which the first signal receiver produces an output signal of a logic low state while the second input signal is inactive and the second signal receiver produces an output signal of a logic high state while the second input signal is inactive.

7. A process of indicating one or another logic state of a first input signal at the transition of a second input signal from an inactive state to an active state, the process comprising:

A. producing an output signal of the one logic state while the second input signal is inactive and producing an output signal of the same logic state as the first input signal while the second input signal is active;

B. generating an output signal of the other logic state while the second input signal is inactive and generating an output signal of the same logic state as the first input signal while the second input signal is active; and C. forming at least one indicate signal of the same logic state as the first input signal in response to a change in logic state in one of the produced and generated output signals.

8. The process of claim 7 in which the first input signal is column address strobe, CAS_, the second input signal is row address strobe, RAS_, the RAS_ signal has an inactive high logic level state and an active low logic level state, and the one logic state is logic level low and the other state is logic level high, and, depending upon the state of CAS_ when RAS_ changes from inactive to active, the formed output signal indicates CAS_ before RAS_ and RAS_ before CAS_.

* * * * *